US009148960B2

(12) United States Patent  
Galloway

(10) Patent No.: US 9,148,960 B2  
(45) Date of Patent: Sep. 29, 2015

(54) RECEIVER OPTICAL ASSEMBLIES (ROAS) HAVING PHOTO-DETECTOR REMOTELY LOCATED FROM TRANSIMPEDANCE AMPLIFIER, AND RELATED COMPONENTS, CIRCUITS, AND METHODS

(71) Applicant: Corning Cable Systems LLC, Hickory, NC (US)

(72) Inventor: Brian Jeffrey Galloway, Hoschton, GA (US)

(73) Assignee: Corning Cable Systems LLC, Hickory, NC (US)

( * ) Notice: Subject to any disclaimer, the term of this patent is extended or adjusted under 35 U.S.C. 154(b) by 0 days.

(21) Appl. No.: 14/060,138

(22) Filed: Oct. 22, 2013

(65) Prior Publication Data

US 2014/0112626 A1    Apr. 24, 2014

Related U.S. Application Data

(63) Continuation-in-part of application No. 13/790,350, filed on Mar. 8, 2013.

(60) Provisional application No. 61/716,868, filed on Oct. 22, 2012.

(51) Int. Cl.  
*G02B 6/28* (2006.01)  
*H05K 3/30* (2006.01)  
(Continued)

(52) U.S. Cl.  
CPC .............. *H05K 3/30* (2013.01); *G02B 6/4279* (2013.01); *H04B 10/69* (2013.01); *H05K 1/0245* (2013.01);

(Continued)

(58) Field of Classification Search  
CPC ........ H04B 10/66; H04B 10/60; H04B 10/40; G02B 6/28; G02B 6/125; G02B 6/2813  
USPC ................. 385/14, 15, 24, 88, 147; 398/202  
See application file for complete search history.

(56) References Cited

U.S. PATENT DOCUMENTS

| 5,046,139 A | 9/1991 | Kahn ............................ 359/124 |
| 6,037,841 A | 3/2000 | Tanji et al. .................... 330/308 |

(Continued)

FOREIGN PATENT DOCUMENTS

WO    93/05571    3/1993    ................ H03F 3/08

OTHER PUBLICATIONS

Sun, et al.,"1-Gb/s 80-dBΩ fully differential CMOS transimpedance amplifier in multichip on oxide technology for optical interconnects", IEEE journal of Solid State Electronics, Jun. 2004, 3 pages.

(Continued)

*Primary Examiner* — Jennifer Doan

(57) ABSTRACT

Embodiments disclosed herein include receiver optical assemblies (ROAs) having a photo-detector remotely located from a differential transimpedance amplifier (TIA). Related components, circuits, and methods are also disclosed. By providing the photo-detector remotely located from a TIA, additional costs associated with design constraints of providing the photo-detector intimate with a TIA may be avoided, thereby reducing cost of the ROA. In this regard as a non-limiting example, the ROAs according to the embodiments disclosed herein allow shorter haul active optical cable applications for use in consumer applications from a cost standpoint with the added benefits of increased bandwidth and low noise performance of optical fiber. In this regard, the ROAs disclosed herein provide higher input impedance differential TIA circuits and transmission circuits inhibiting or reducing ringing effects and maintain a sufficiently low resistance-capacitance (RC) time constant for differential TIA circuit to allow for higher bandwidth operation of the ROA.

23 Claims, 8 Drawing Sheets

(51) Int. Cl.
*H04B 10/69* (2013.01)
*H05K 1/02* (2006.01)
*G02B 6/42* (2006.01)

(52) U.S. Cl.
CPC .............. *G02B 6/4284* (2013.01); *H05K 1/025* (2013.01); *H05K 2201/10121* (2013.01); *Y10T 29/49128* (2015.01)

(56) References Cited

U.S. PATENT DOCUMENTS

| | | | |
|---|---|---|---|
| 8,391,727 B2 * | 3/2013 | Steffan et al. | 398/212 |
| 8,891,975 B2 | 11/2014 | Yagisawa et al. | |
| 2003/0193704 A1 * | 10/2003 | Miremadi | 359/213 |
| 2008/0298815 A1 | 12/2008 | Khalouf et al. | 398/202 |
| 2011/0058818 A1 | 3/2011 | Karnopp et al. | 398/135 |
| 2011/0311232 A1 | 12/2011 | Morita et al. | 398/141 |
| 2012/0170944 A1 | 7/2012 | Yagisawa et al. | 398/200 |

OTHER PUBLICATIONS

Patent Cooperation Treaty, International Search Report and Written Opinion for International Application No. PCT/US2013/065203; Mailing Date Feb. 12, 2014—13 pages.

* cited by examiner

RECEIVER OPTICAL ASSEMBLIES (ROAS) HAVING PHOTO-DETECTOR REMOTELY LOCATED FROM TRANSIMPEDANCE AMPLIFIER, AND RELATED COMPONENTS, CIRCUITS, AND METHODS

PRIORITY APPLICATIONS

This patent application is a continuation-in-part application of U.S. patent application Ser. No. 13/790,350 filed on Mar. 8, 2013, the contents of which is relied upon and incorporated herein by reference in its entirety, and the benefit of priority under 35 U.S.C. §120 is hereby claimed.

This patent application also claims priority to U.S. Provisional Application Ser. No. 61/716,868 filed on Oct. 22, 2012, the contents of which is relied upon and incorporated herein by reference in its entirety, and the benefit of priority under 35 U.S.C. §119 is hereby claimed.

BACKGROUND

1. Field of the Disclosure

The technology of the disclosure relates to receiver optical assemblies (ROAs) that receive optical signals from an optical fiber and convert the received optical signals into electrical signals.

2. Technical Background

As interconnect line speeds increase, such as five (5) to ten (10) Gigabits per second (Gbps), and beyond, active optical cables (ADCs) are increasingly being used as an alternative to traditional copper cables. Active optical cables allow electrical signals to be converted and carried as optical signals over optical fiber. Benefits of utilizing optical fiber include extremely wide bandwidth and high immunity to environmental electronic noise.

In this regard, FIG. 1 illustrates an exemplary active optical cable 10. As illustrated in FIG. 1, the active optical cable 10 includes end connectors 12A, 12B. Each end connector 12A, 12B includes electrical conductor inputs 14A configured to receive input electrical signals and electrical conductor outputs 14B configured to provide output electrical signals. Opto-electronic transceivers 16A, 16B are included in end connector housings 18A, 18B for each of the end connectors 12A, 12B, respectively. The opto-electronic transceivers 16A, 16B each include transmitter optical sub-assemblies (TOSAs) (not shown) that receive electrical input signals from the electrical conductor inputs 14A and convert the received electrical input signals into optical signals to be transmitted over optical fiber 16. The opto-electronic transceivers 16A, 16B also each include receiver optical sub-assemblies (ROSAs) (not shown) that convert the optical signals transmitted over the optical fiber 16 back into electrical signals to be provided as electrical output signals on the electrical conductor outputs 14B.

Active optical cables are commonly used in data centers to deliver voice, video, and data transmissions to subscribers over both private and public networks. For example, active optical cables can support interconnections between servers, storage area networks (SANs), and/or other equipment at data centers. At longer distances, active optical cables can be less expensive than traditional copper cables at the same distances which employ repeaters. The additional cost of the opto-electronics and optical fiber alignment components is less significant when compared to the cost of the optical fiber in the active optical cable. Also, the cost of a longer haul active optical cable can be amortized by service providers over the larger number of customers that can receive services over the active optical cable compared to the copper cable.

For shorter length active optical cable, the additional component costs contribute a greater percentage of the overall cost of the active optical cable thereby resulting in a more expensive cable over traditional copper cables having the same shorter length. Thus, active optical cables have not been typically designed for use in consumer applications at shorter lengths (e.g., consumer electronic devices, personal computers, external hard drives, digital cameras, and televisions). The higher cost of active optic cables for shorter cable distances is not perceived as providing enough value to consumers to justify the increased cost over traditional copper cables. However, consumer applications are starting to require higher bandwidths that can benefit from optical fiber cables. Thus, there is an unresolved need for short-haul active optical cables suitable for use in consumer applications that benefit from the increased bandwidth and low noise operation of optical fiber and that are commercially viable.

SUMMARY

Embodiments disclosed herein include receiver optical assemblies (ROAs) having a photo-detector remotely located from transimpedance amplifier (TIA). The TIA may be a complementary metal oxide semiconductor (CMOS)-based TIA in one non-limiting example. Related components, circuits, and methods are also disclosed. The ROA concepts of the present application use design differences that are contrary to conventional ROSA designs for conventional long-haul applications. For instance, by providing the photo-detector remotely located from a TIA, additional costs associated with conventional design constraints of providing the photo-detector intimate with a TIA may be avoided, thereby reducing the cost of the ROA. For example, expensive bonding assembly techniques to directly connect a photo-detector to a TIA may be avoided. In this regard as a non-limiting example, the ROAs according to the embodiments disclosed herein may allow shorter haul active optical cable applications to be more readily accepted for use in consumer applications from a cost standpoint with the added benefits of increased bandwidth and low noise performance of optical fiber. To provide for a photo-detector to be remotely located from a TIA in a ROA, design constraints associated with typical receiver optical sub-assemblies (ROSA) are avoided.

In this regard in embodiments disclosed herein, a differential TIA circuit is provided with a higher TIA input impedance. The wiring connections coupling the photo-detector to the differential TIA circuit in the ROA are provided as an impedance-controlled transmission circuit. Providing a higher TIA input impedance allows the differential TIA circuit to absorb electrical signals received over the transmission circuit coupling a photo-detector to the TIA to inhibit or reduce ringing effects on the transmission circuit. Further, by providing an impedance-controlled transmission circuit coupling the photo-detector to the TIA, capacitance components of the transmission circuit can be reduced or eliminated to prevent or reduce a resistance-capacitance (RC) time constant for differential TIA circuit to allow for higher bandwidth operation. In this regard, the capacitance of the photo-detector can be designed to be the limiting capacitance factor for a low RC time constant for the differential TIA circuit for high bandwidth operation. In one non-limiting embodiment, the transmission circuit is impedance-matched or substantially impedance-matched to the TIA input impedance of the differential TIA circuit such as by using electrical traces or the like.

In this regard, in one embodiment, a receiver optical assembly (ROA) is provided. The ROA comprises a photo-detector disposed in an optical header packaging, the photo-detector configured to detect and convert input optical signals into output electrical signals. The ROA also comprises a CMOS-based differential transimpedance amplifier (TIA) circuit disposed in an integrated circuit remotely located from the optical header packaging. The CMOS-based differential TIA circuit comprises a first differential input node and a second differential input node, wherein the CMOS-based differential TIA circuit has a TIA input impedance of at least ten (10) ohms to reduce a ringing effect over the first differential input node and the second differential input node. The ROA also comprises a transmission circuit comprised of a first transmission line coupled to the first differential input node, and a second transmission line coupled to the second differential input node. A first node of the photo-detector coupled to the first transmission line and a second node of the photo-detector coupled to the second transmission line to couple the photo-detector to the CMOS-based differential TIA circuit to amplify the output electrical signals received from the photo-detector.

In another embodiment, a method of assembly of a ROA is provided. The method comprises disposing a photo-detector in an optical header packaging on a printed circuit board (PCB), the photo-detector configured to detect and convert input optical signals into output electrical signals. The method also comprises disposing a CMOS-based differential TIA circuit provided in an integrated circuit on the PCB remotely located from the optical header packaging, the CMOS-based differential TIA circuit comprising a first differential input node and a second differential input node, and the CMOS-based differential TIA circuit having a TIA input impedance of at least ten (10) ohms to reduce a ringing effect over the first differential input node and the second differential input node. The method also comprises disposing a transmission circuit in the PCB comprised of disposing a first transmission line as a first PCB trace in the PCB and a second transmission line as a second PCB trace in the PCB. The method also comprises coupling the first differential input node of the CMOS-based differential TIA circuit to the first transmission line and coupling the second differential input node of the CMOS-based differential TIA circuit to the second transmission line. The method also comprises coupling a first node of the photo-detector to the first transmission line and coupling a second node of the photo-detector to the second transmission line to couple the photo-detector to the CMOS-based differential TIA circuit to amplify the output electrical signals received from the photo-detector.

In another embodiment, another exemplary ROA is provided. The ROA comprises a photo-detector disposed in an optical header packaging, the photo-detector configured to detect and convert input optical signals into output electrical signals. The ROA also comprises a CMOS-based differential TIA circuit. The CMOS-based differential TIA circuit comprises a first CMOS-based TIA having a first differential input node and a first output node. The CMOS-based differential TIA circuit also comprises a second CMOS-based TIA having a second differential input node and a second output node. The ROA also comprises an output CMOS-based differential amplifier having a first differential input node coupled to the first output node of the first CMOS-based TIA, and a second differential input node coupled to the second output node of the second CMOS-based TIA, wherein the CMOS-based differential amplifier is configured to reject common noise amplified by the first CMOS-based TIA and the second CMOS-based TIA. The ROA also comprises the CMOS-based differential TIA circuit having a TIA input impedance of at least ten (10) ohms to reduce a ringing effect over the first differential input node and the second differential input node. The ROA also comprises a transmission circuit comprised of a first transmission line coupled to the first differential input node of the first CMOS-based TIA, and a second transmission line coupled to the second differential input node of the second CMOS-based TIA. A first node of the photo-detector is coupled to the first transmission line and a second node of the photo-detector is coupled to the second transmission line to couple the photo-detector to the CMOS-based differential TIA circuit to amplify the output electrical signals received from the photo-detector.

The concepts also may be used with integrated circuits. In one embodiment, an integrated circuit comprises a complementary metal oxide semiconductor (CMOS)-based differential transimpedance amplifier (TIA) circuit comprising a first differential TIA having a first single-ended input node and a second differential TIA having a second single-ended input node that produce single-ended outputs that are differentially combined in an output differential amplifier to reject common-mode signals, and the CMOS-based differential TIA circuit having a TIA input impedance of at least ten (10) ohms to reduce a ringing effect over the first single-ended input node and the second single-ended differential input node. However, other arrangements are possible with integrated circuits using the concepts disclosed.

Additional features and advantages will be set forth in the detailed description which follows, and in part will be readily apparent to those skilled in the art from that description or recognized by practicing the embodiments as described herein, including the detailed description that follows, the claims, as well as the appended drawings.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

DETAILED DESCRIPTION

Figure 1:
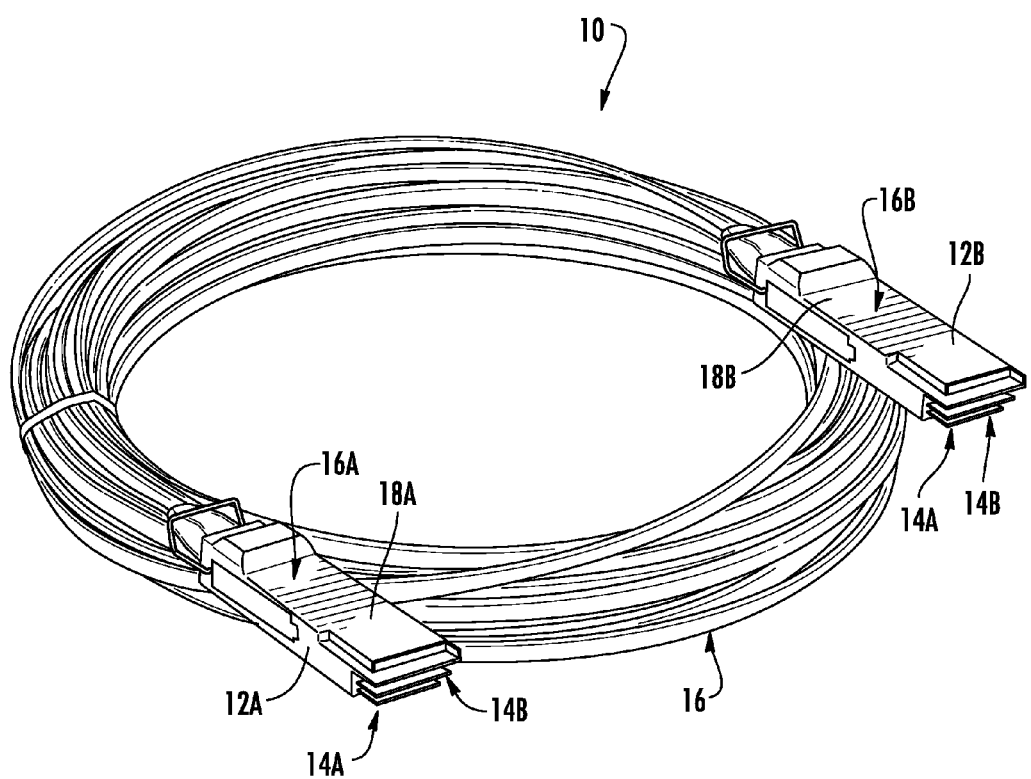
FIG. 1 is an exemplary active optical cable (AOC) that employs end connectors having electrical conductor inputs and electrical conductor outputs, electrical-to-optical (E-O) converters to convert and carry electrical input signals as optical signals over optical fiber, and optical-to-electrical (O-E) converters to convert the carried optical signals back into electrical output signals.

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Embodiments disclosed herein include receiver optical assemblies (ROAs) having a photo-detector remotely located from transimpedance amplifier (TIA) that is suitable for short-haul applications. The TIA may be a complementary metal oxide semiconductor (CMOS)-based TIA in one non-limiting example. Related components, circuits, and methods are also disclosed. On the other hand, conventional long-haul ROSA designs have the photodiode intimately connected with the TIA and are not suitable for short-haul applications as discussed herein. By providing the photo-detector remotely located from a TIA, additional costs associated with design constraints of providing the photo-detector intimate with a TIA may be avoided, thereby reducing the cost of the ROA. For example, expensive bonding assembly techniques to directly connect a photo-detector to a TIA may be avoided. In this regard as a non-limiting example, the ROAs according to the embodiments disclosed herein may allow shorter haul active optical cable applications to be more readily accepted for use in consumer applications from a cost standpoint with the added benefits of increased bandwidth and low noise performance of optical fiber along with other features such as common mode rejection of noise. To provide for a photo-detector to be remotely located from a TIA in a ROA, conventional design constraints and practices associated with conventional receiver optical sub-assemblies (ROSA) are avoided.

In this regard in embodiments disclosed herein, a differential TIA circuit is provided with a higher TIA input impedance. Moreover, the wiring connections coupling the photo-detector to the differential TIA circuit in the ROA are provided as an impedance-controlled transmission circuit. In one non-limiting embodiment, the transmission circuit is impedance-matched or substantially impedance-matched to the TIA input impedance of the differential TIA circuit. Providing a higher TIA input impedance allows the differential TIA circuit to absorb electrical signals received over the transmission circuit coupling a photo-detector to the TIA to inhibit or reduce ringing effects on the transmission circuit. Further, by providing an impedance-controlled transmission circuit coupling the photo-detector to the TIA, capacitance components of the transmission circuit can be reduced or eliminated to inhibit or reduce a resistance-capacitance (RC) time constant for differential TIA circuit to allow for higher bandwidth operation. In this regard, the capacitance of the photo-detector can be designed to be the limiting capacitance factor for a low RC time constant for the differential TIA circuit for high bandwidth operation.

Figure 2:
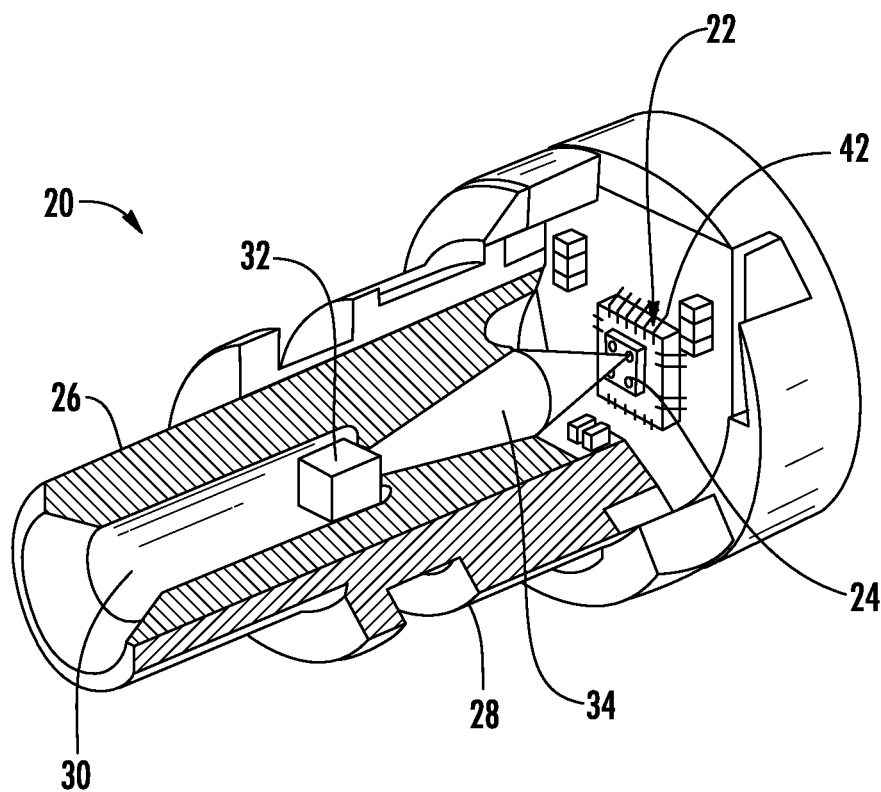
FIG. 2 is a schematic diagram of an conventional receiver optical sub-assembly (ROSA) that may be employed in the long-haul active optical cable in FIG. 1, wherein the ROSA includes a photo-detector directly attached to a transimpedance amplifier (TIA) having a low input impedance to maximize bandwidth performance and provide high TIA sensitivity to compensate for long-haul optical losses.
Figure 3:
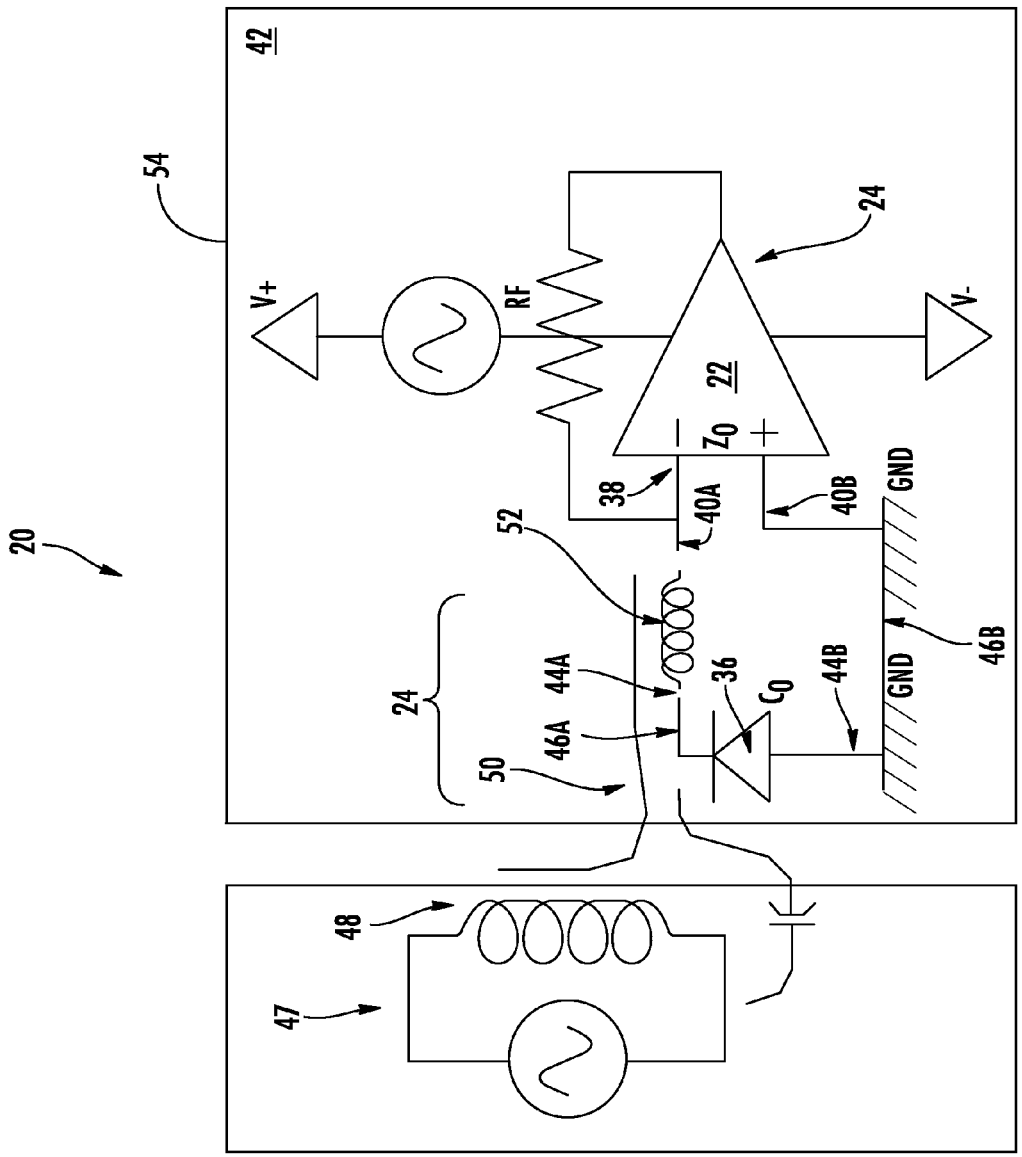
FIG. 3 is a circuit diagram of the photo-detector and TIA of the conventional ROSA in FIG. 2, wherein electrodes of the photo-detector are directly coupled to the negative input of the TIA to reduce or eliminate the effect of the photo-detector electrodes acting as current loop antennas to reduce inductively coupled noise and for high TIA sensitivity.

Before discussing the exemplary embodiments of a ROA that includes a photo-detector remotely located from a higher input impedance CMOS-based TIA via impedance-controlled transmission lines, a conventional receiver optical subassembly (ROSA) designed for long-haul communications in the prior art is first discussed with regard to FIGS. 2 and 3. The discussion of the ROSA in FIGS. 2 and 3 is to illustrate typical ROSA design constraints that are cost problematic for use in shorter haul active optical cables, and which are addressed by embodiments of the present disclosure. For example, shorter haul cables may be less than 100 meters as a non-limiting example, but other short lengths are also possible.

In this regard, FIG. 2 is a schematic diagram of a conventional receiver optical sub-assembly (ROSA) 20. An example of the conventional ROSA 20 that is designed for long-haul optical fiber, including the active optical cable 10 in FIG. 1, is disclosed in U.S. Pat. No. 7,160,039. The conventional ROSA 20 may be employed in the active optical cable 10 in FIG. 1. As will be discussed in more detail below, the conventional ROSA 20 includes a transimpedance amplifier (TIA) 22 with a low input impedance and a photo-detector 24 directly mounted to the TIA 22 to reduce input capacitance for high bandwidth performance and to reduce or eliminate the TIA 22 amplifying extraneous noise. FIG. 3 is an exemplary circuit diagram of the photo-detector 24 of the conventional ROSA 20 in FIG. 2. The conventional ROSA 20 of FIG. 2 and the circuit diagram of the exemplary TIA 22 and photo-detector 24 of the conventional ROSA 20 in FIG. 3 will be described in conjunction below.

The conventional ROSA 20 in FIGS. 2 and 3 is designed for use in long-haul optical signal transmissions to provide for high bandwidth operation and high TIA 22 sensitivity while minimizing amplification of extraneous noise. With reference to FIG. 2, the conventional ROSA 20 is provided as part of a fiber optic connector 26. The fiber optic connector 26 includes a housing 28 that includes a bore 30. The bore 30 is configured to receive a fiber optic ferrule (not shown) disposed on an end of an optical fiber (not shown) for receiving input optical signals to be converted to output electrical signals. An optical insert 32 is provided in the bore 30. The optical insert 32 is configured to be optically connected to the optical fiber of the fiber optic ferrule inserted into the bore 30. The input optical signals received from the optical fiber are refracted by the optical insert 32 as a beam of light 34 directed to the photo-detector 24. For example, as illustrated in the circuit diagram of FIG. 3, the photo-detector 24 is a reverse-biased photodiode 36 which responds to an incident optical signal by generating an electrical output current signal with an alternative current (AC) and direct current (DC) component. As is well known, the TIA 22 converts the current input signals from the photodiode 36 at a negative input node 38 of the TIA 22 to voltage output signals having gain that is a function of the value of the feedback resistor $R_F$ (e.g., 1000 ohms to provide a $10^3$ gain of a 1 milliAmp (mA) signal to 1 Volt (V)).

With reference to the circuit diagram in FIG. 3, the TIA 22 of the conventional ROSA 20 is provided with the lowest possible input impedance $Z_0$ (e.g., one (1) to ten (10) ohms) so that the negative input node 38 of the TIA 22 is in essence short circuited to the ground node GND. Thus, the input impedance $Z_0$ is in parallel with the photodiode 36. The capacitance $C_0$ of the photodiode 36, which may be as little as a few pico Farads (pF), is disposed in parallel with the input impedance $Z_0$ of the TIA 22. This allows high bandwidth operation of the TIA 22 when converting input optical signals to output electrical signals in the conventional ROSA 20, because at the negative input node 38, which is the critical node for current measurement speed by the TIA 22, the low input impedance of the TIA 22 provides a low impedance $Z_0$ capacitance $C_0$ ($Z_0 C_0$) time constant. Providing a low $Z_0 C_0$ time constant allows the TIA 22 to measure current at the negative input node 38 faster, thus providing higher bandwidth operation and capability for the conventional ROSA 20. If the TIA 22 is not provided with a low input impedance $Z_0$, the capacitance $C_0$ of the photodiode 36 may only allow MegaHertz (MHz) of bandwidth operation as opposed to GigaHertz (GHz) operation, which is desired for active optical cables applications.

To provide a high TIA 22 sensitivity in conventional designs, the photodiode 36 of the photo-detector 24 is located as close as possible to the TIA 22. Thus, with continuing reference to FIG. 3, electrical input contacts 40A, 40B on a mounting surface of an integrated circuit (IC) chip 42 of the TIA 22 are directly connected to corresponding electrodes 44A, 44B of the photo-detector 24. For example, this direct connection may be provided via direct bonding using bond wires, or with the use of solder bumps in a flip chip bonding process. This allows shorter length connection wires 46A, 46B or other bonds between the electrodes 44A, 44B of the photodiode 36, and the electrical input contacts 40A, 40B of the TIA 22. In this manner, the shorter length connection wires 46A, 46B do not act as current loop antennas, and thus receive and couple outside RF radio signals and other extraneous noise that would otherwise be amplified by the highly sensitive TIA 22 and reduce performance.

For example, a switching power supply 47 powering the TIA 22 may have magnetic GHz noise components from an inductor 48 that are more readily coupled by a representative flux line 50 into an interconnect inductance 52 of a longer length connection wire 46A. The GHz noise components of the switching power supply prevent the use of switching power supply 47 with the ROA 20 in this embodiment without impacting the bandwidth performance of the ROA 20. As illustrated in FIG. 3, the photo-detector 24 is provided as part of the common packaging 54. The conventional ROSA 20 may also be hermetically sealed and RF shielded to eliminate or reduce the connection wires 46A, 46B and electrodes 44A, 44B of the photodiode 36 coupling to outside RF radio signals and other inductive noise to allow for high TIA 22 sensitivity.

Thus, in summary, to maximize bandwidth performance of the conventional ROSA 20 in FIGS. 2 and 3 designed for long-haul optical signal transmissions, the TIA 22 should be designed with the lowest possible input impedance $Z_0$. The conventional ROSA 20 design makes no attempt to control impedance. The input impedance $Z_0$ is not impedance-matched to the impedance of the electrodes 44A, 44B of the photo-detector 24 so that the bandwidth performance of the TIA 22 is directly a function of capacitance $C_0$ of the photodiode 36 present at the negative input node 38 of the TIA 22. Providing low input TIA 22 impedance provides a low $Z_0 C_0$ time constant that allows the TIA 22 to measure current at the negative input node 38 faster, thus providing higher bandwidth operation for the conventional ROSA 20. It is also desired to provide high TIA 22 sensitivity to compensate for the optical signal losses by providing a short length connection between the electrodes 44A, 42B of the photodiode 36, and the electrical input contacts 40A, 40B of the TIA 22. In this manner, the electrodes 44A, 44B of the photodiode 36 in conventional designs do not act as current loop antennas to receive and couple outside RF radio signals and other inductive noise that is amplified by the highly sensitive TIA 22.

On the other hand, there is an unresolved need for shorter haul active optical cables so consumer applications and the like can enjoy the benefit of increased bandwidth and low noise operation of optical fiber. But even with the increased bandwidth and low noise operation of active optical cables, the higher cost of active optic cable components, including a conventional ROSA design, may not provide enough enhanced value to certain consumers to justify the increased cost for shorter cable lengths compared with high-speed copper cables. Thus, the conventional ROSA design employed in the conventional ROSA 20 of FIGS. 2 and 3 may be cost prohibitive for use in shorter haul active optical cables. For example, the conventional ROSA 20 in FIGS. 2 and 3 may require expensive bonding assembly techniques to directly connect the photo-detector 24 to the TIA 22 over short length connections. Expensive flip chip bonding may be used, which may require ceramic carriers. Expensive wire bonding assembly techniques, such as the use of meshed wiring, may be employed.

Further, the conventional ROSA 20 in FIGS. 2 and 3 also requires expensive packaging for hermetic sealing and RF shielding of the photo-detector 24 and the TIA 22. For example, expensive gold plated graft blocks with sapphire substrates and microwave transitions may be employed. The hermetic sealing and RF shielding must also be provided for the entire common packaging 54, because the photo-detector 24 and the TIA 22 must be closely located to each other to provide high TIA 22 sensitivity, as discussed above. The common packaging 54 must also be sufficiently sized to house both the TIA 22 and the photo-detector 24, and may have to provide a lid to allow separate access to the TIA 22 and the photo-detector 24 during assembly and/or testing. The common packaging 54 must also provide for the ability to receive and align optical fibers to the photo-detector 24 while still maintaining hermetic sealing and RF shielding. This can require expensive, precision manufacturing of the common packaging 54 thereby increasing the cost of the conventional ROSA 20.

On the other hand, short-haul active optical cables will need to have costs that are comparable with high-speed electrical cables at least for short lengths. If the cost of the ROSA in short-haul active optical cables can be reduced, the overall cost of short-haul active optical cables can be reduced, thereby making shorter haul active optical cables more readily accepted for use in consumer applications and the like with the added benefits of increased bandwidth and low noise performance.

Figure 4:
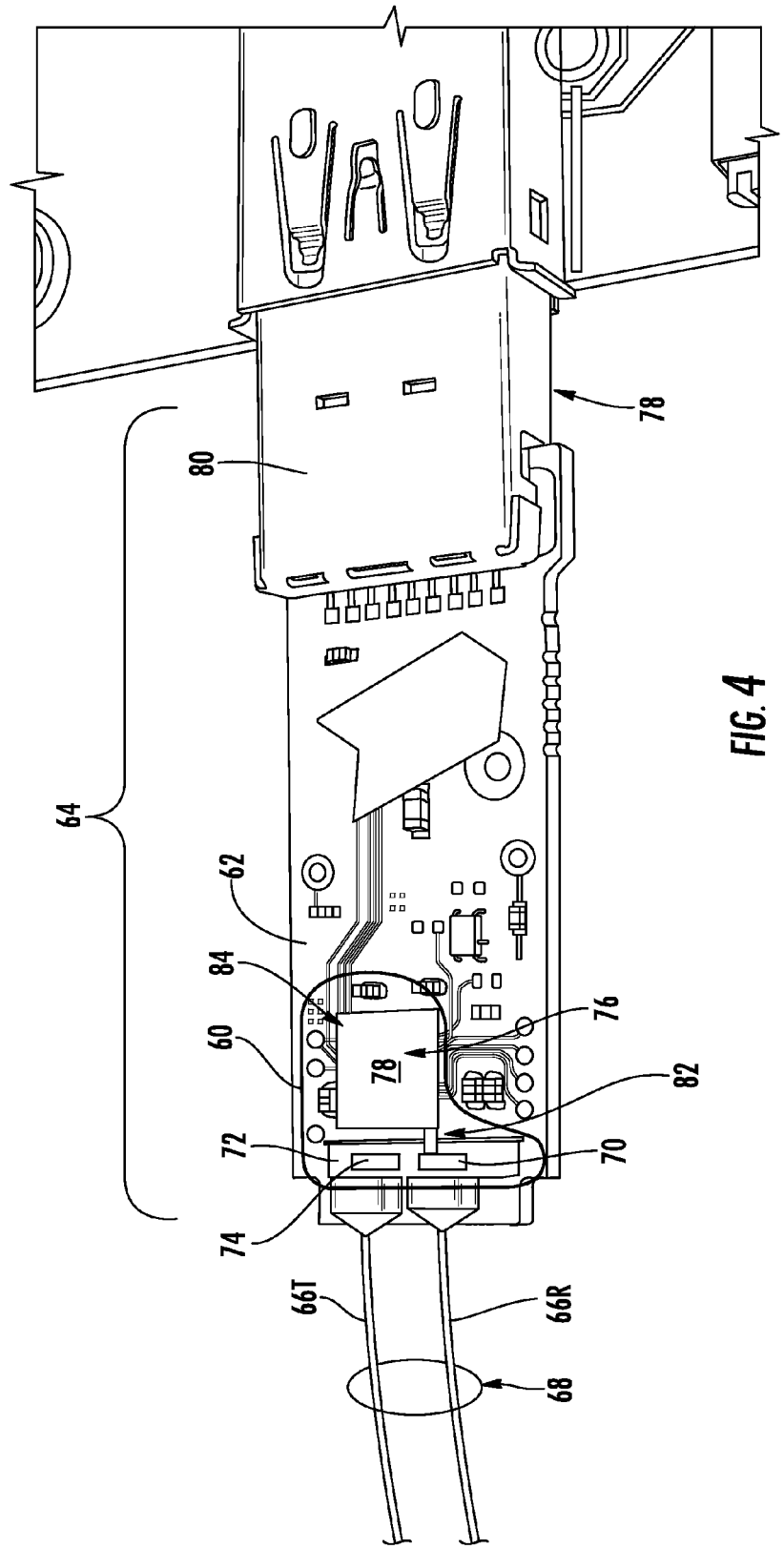
FIG. 4 is a diagram of an exemplary receiver optical assembly (ROA) disposed on a printed circuit board (PCB) as part of an exemplary universal serial bus (USB) connector that can be employed in an active optical cable, wherein the ROA includes a photo-detector remotely located from and coupled to a higher input impedance TIA via impedance-controlled transmission lines.
Figure 5:
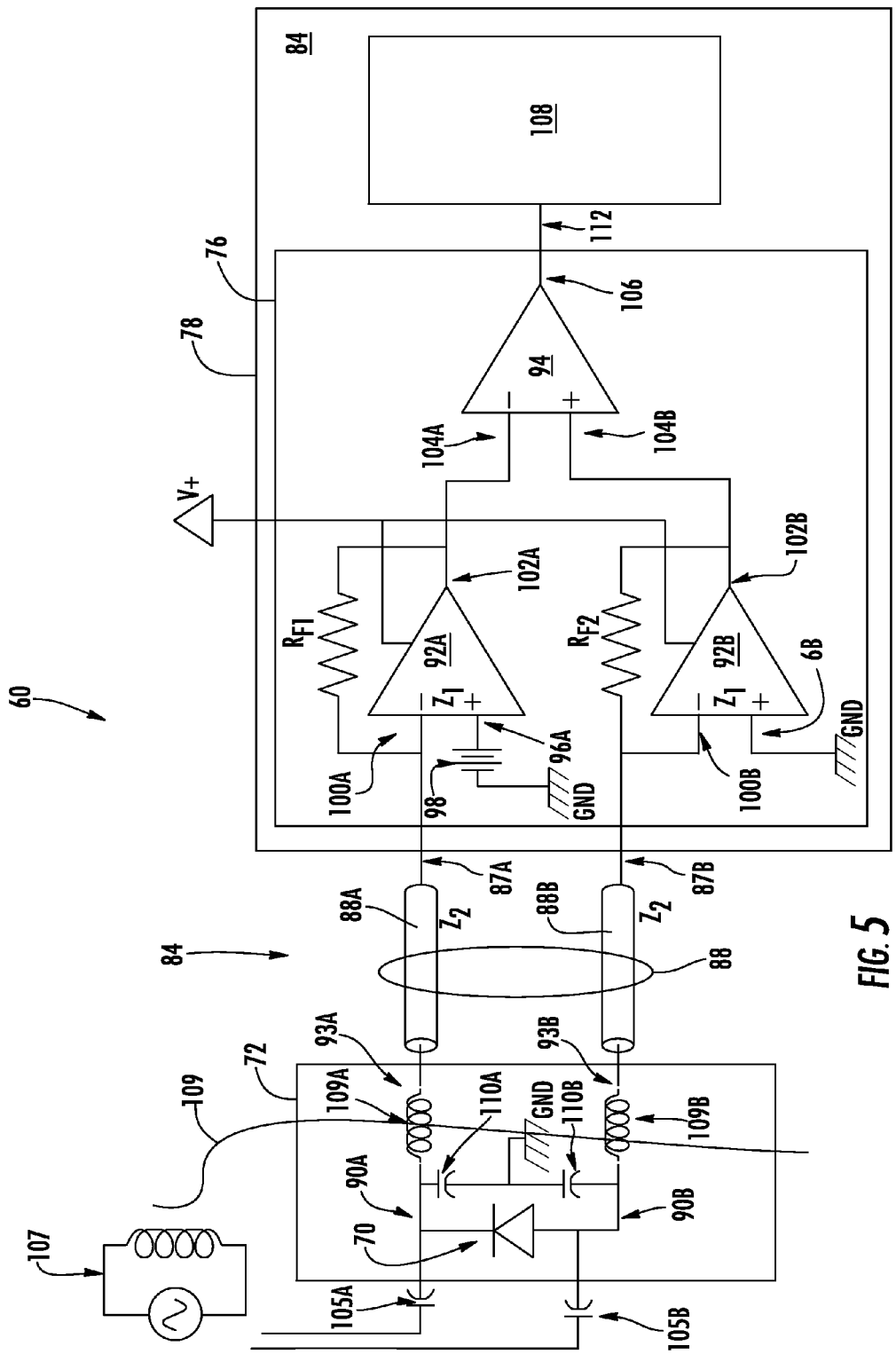
FIG. 5 is a circuit diagram of the ROA of FIG. 4 employing a photo-detector remotely located from a higher input impedance TIA via impedance-controlled transmission lines.

FIGS. 4 and 5 describe one such ROA suitable for use in short-haul applications such as about 100 meters or less. In this regard, FIG. 4 is a diagram of an exemplary receiver optical assembly (ROA) 60 disposed on a printed circuit board (PCB) 62 as part of an assembly for an exemplary universal serial bus (USB) connector 64. The ROA 60 can be employed in an active optical cable for providing optical fiber transmission over a receiver optical fiber 66R and a transmitter optical fiber 66T of an active optical fiber USB cable 68. The active optical fiber USB cable 68 in FIG. 4 is a shorter length cable, such as between one (1) and one hundred (100) meters (m), as non-limiting examples. The ROA 60 includes a photodiode 70 disposed in an optical header packaging 72. The optical header packaging 72 can be any enclosure or packaging desired to house the photodiode 70. The optical header packaging 72 may be hermetically sealed and include conductor pins for interfacing with the components disposed in the optical header packaging 72, including the photodiode 70. As a non-limiting example, the optical header packaging 72 may include a small plastic-molded lead frame package. As another example, the optical header packaging 72 could include a PCB disposed on its side using metallic castellations on the side of the PCB to provide surface mount solder connections.

With continuing reference to FIG. 4, the optical header packaging 72 in this embodiment also includes a laser 74 configured to transmit output optical signals converted from input electrical signals over the transmitter optical fiber 66T. In this embodiment, the photodiode 70 is provided separately and apart from the differential TIA circuit 76. The photodiode 70 in the optical header packaging 72 is remotely located from a higher input impedance differential TIA circuit 76 disposed in a protocol chip 78 such as an integrated circuit (IC) chip. By remotely located, it is meant that the photodiode 70 and the differential TIA circuit 76 are not provided in the same packaging, nor bonded directly together. Thus, there is no transimpedeance amplifier included in the optical header packaging 76 on purpose and by design for the reasons previously discussed above. In other words, the TIA circuit is remotely located from the optical header packaging. The optical header packaging 72 is entirely passive in this embodiment and serves to turn the laser 74 and photodiode 70 at right angles to the PCB 62 to make it possible to butt-couple the optical fibers 66T, 66R into the active areas of the PCB 62.

With continuing reference to FIG. 4, the photodiode 70 in the optical header packaging 72 is remotely located from a higher input impedance differential TIA circuit 76 disposed in a protocol chip 78 to reduce the cost of the ROA 60. In this manner, two separate IC chips—one for the differential TIA circuit 76 and a separate IC chip for a protocol chip 78 are not required. The differential TIA circuit 76 can be provided in the protocol chip 78 to reduce the number of IC chips and reduce cost of the ROA 60. In other words, all active components except for the ROA 60 and laser 74 may be provided in the single protocol chip 78 (e.g. a complementary metal-oxide semiconductor (CMOS chip)) to reduce cost of the assembly. The protocol chip 78 in this embodiment includes the necessary circuitry to transmit and receive electrical signals to and from USB pins (not shown) in a USB connector sheath 80 according to a USB protocol. Note that the concepts used with protocol chip 78 are not limited to USB protocol, but may be used with other suitable protocol chips as desired.

With continuing reference to FIG. 4, because the photodiode 70 is provided apart and separate from the differential TIA circuit 76 in the protocol chip 78, the additional costs associated with the design constraints of the conventional ROSA 20 in FIGS. 2 and 3 may be avoided for the ROA 60. For example, expensive bonding assembly techniques to directly connect the photodiode 70 to the differential TIA circuit 76 over short length connections can be avoided. However, as will be discussed in more detail below, the wiring connections 82 coupling the photodiode 70 and the differential TIA circuit 76 in the protocol chip 78 will be longer, because the coupling transitions between the optical header packaging 72 and the protocol chip 78 are located separately and remotely from each other. For example, the wiring connections 82 coupling the photodiode 70 and the differential TIA circuit 76 in the protocol chip 78 may be approximately one (1) millimeter (mm) in length, which is considered remotely located for high-speed data transmission. The photodiode 70 does not have to be included in hermetically sealed and a protocol chip packaging 84 for the protocol chip 78. For example, providing the photodiode 70 in a separate packaging from the differential TIA circuit 76 can allow a low cost injection-molded plastic packaging to be used as the protocol chip packaging 84. Thus, the protocol chip packaging 84 does not have to provide for the ability to receive and align the optical fibers 66T, 66R to the photodiode 70 while still maintaining hermetic sealing and RF shielding. The protocol chip packaging 84 can be composed of a material or structure to provide RF shielding. Further, the protocol chip packaging 84 does not have to be sufficiently sized to house both the differential TIA circuit 76 and the photo-detector 70. The ROA 60 in FIG. 4 also allows the photodiode 70 to be separately accessed during assembly and/or testing without having to access or open the protocol chip packaging 84.

Most of the design considerations and techniques employed in the conventional ROSA 20 in FIGS. 2 and 3 are avoided in the ROA 60 of FIG. 4 and a new design logic is used. For example, if the differential TIA circuit 76 in the ROA 60 of FIG. 4 were provided with a low input impedance as provided in the TIA 22 of the conventional ROSA 20, several issues would result. First, the longer wiring connections 82 coupling the separate optical header packaging 72 and the protocol chip 78 would increase the capacitance on the wiring connections 82 and coupled to the input of the differential TIA circuit 76, thus increasing the resistance-capacitance (RC) time constant and decreasing bandwidth performance of the ROA 60. Second, if the differential TIA circuit 76 has a low input impedance, the electrical current transmitted from the photodiode 70 over the wiring connections 82 to the differential TIA circuit 76 will reflect back on the wiring connections 82 back to the photodiode 70 and back to the differential TIA circuit 76 and so on providing a ringing effect on the wiring connections 82, thereby decreasing bandwidth performance. By way of example, electrical signal pulses may bounce back and forth between the photodiode 70 and the differential TIA circuit 76 ten (10) to fifteen (15) times and provide undesirable ringing.

Thus in summary, design considerations and techniques involved around providing a low input impedance TIA 22 in the conventional ROSA 20 in FIGS. 2 and 3 are not suitable for the ROA 60 of FIG. 4. The cost reductions realized from providing the photodiode 70 remotely located from the differential TIA circuit 76 in the protocol chip 78 may not justify the decreased bandwidth performance if the design considerations and techniques involved in the conventional ROSA 20 in FIGS. 2 and 3 are employed in the ROA 60 of FIG. 4.

To address the issues of increased capacitance and electrical signal ringing over the wiring connections 82, an alternative circuit is provided for the photodiode 70 and differential TIA circuit 76. In this regard, FIG. 5 is an exemplary circuit that can be provided in the ROA 60 of FIG. 4 to take into consideration the photodiode 70 being remotely located from the differential TIA circuit 76 in the protocol chip 78 while minimizing the impact on bandwidth performance. In the ROA 60 in FIG. 5, as will be discussed in more detail below, the differential TIA circuit 76 is provided with a higher TIA input impedance $Z_1$ than input impedance $Z_0$ of the TIA 22 in the conventional ROSA 20 of FIGS. 2 and 3. The higher TIA input impedance $Z_1$ is provided for the differential TIA circuit 76 to allow the differential TIA circuit 76 to absorb the electrical signals and inhibit or reduce ringing on the wiring connections 86. The concepts disclosed may be used and applied as a portion of an integrated circuit (IC) having one or more differential TIAs.

Also, the wiring connections 86 coupling the photodiode 70 to the differential TIA circuit 76 in the ROA 60 are provided as an impedance-controlled transmission circuit 88. As will also be discussed in more detail below, the impedance-controlled transmission circuit 88 in this embodiment is comprised of a first transmission line 88A and a second transmission line 88B to provide a coupling to the nodes of the photodiode 70 and to provide common mode rejection of noise. The transmission lines 88A, 88B each have a transmission impedance $Z_2$. In this manner, the capacitance component of the transmission lines 88A, 88B is reduced or eliminated to inhibit or reduce the transmission lines 88 to allow longer wiring connections 86 for providing the photodiode 70 remotely from the differential TIA circuit 76 while providing a RC time constant of the differential TIA circuit 76 that allows for higher bandwidth operation of the differential TIA circuit 76. Any capacitance component of the transmission lines 88A, 88B is in addition to the capacitance $C_1$ of the photodiode 70 as part of the RC time constant of the differential TIA circuit 76.

Figure 6:
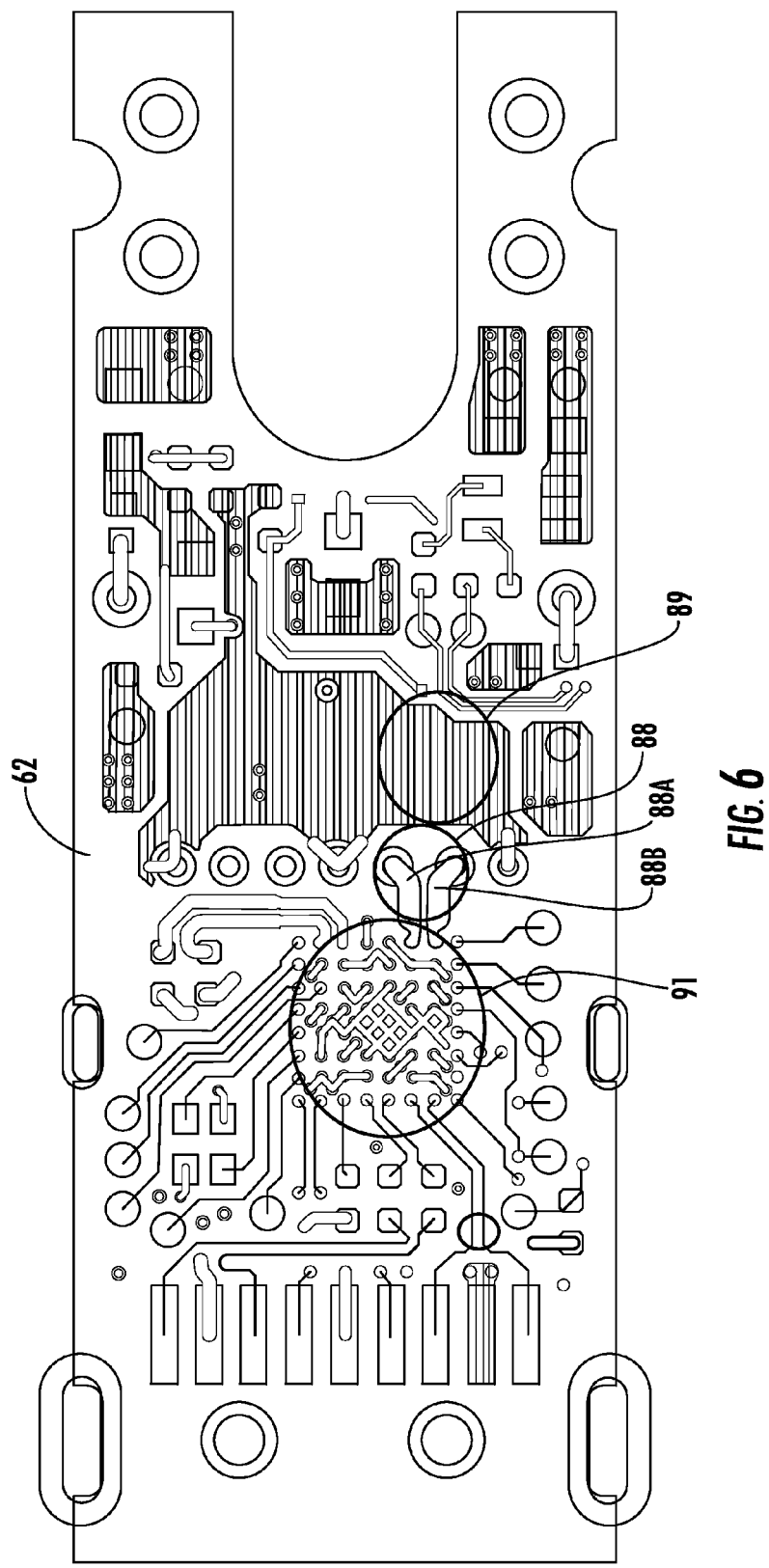
FIG. 6 is a schematic diagram a close-up view of the PCB for the ROA in FIG. 4 illustrating the PCB metallization pattern to support photo-detector pads remotely located from and coupled to TIA pads via PCB trace transmission lines.

In this example, the transmission lines 88A, 88B are provided to have an impedance of thirty-five (35) ohms. In one embodiment, the transmission lines 88A, 88B are implemented on a PCB, such that a range of transmission impedances $Z_2$ that can be supported by the PCB are feasible by using electrical traces with a predetermined impedances such as based on size or the like. For example, the transmission lines 88A, 88B can be fabricated on the PCB 62 in FIG. 4 to provide a desired transmission impedance $Z_2$ between ten (10) and two hundred (200) ohms as a non-limiting example. In one specific embodiment, the transmission impedances $Z_2$ such as at least ten (10) ohms. An example of providing the transmission lines 88A, 88B is illustrated in FIG. 6 as a close-up view of the PCB 62 for the ROA 60 in FIG. 4. There, the pads 89 for the photodiode 70 and the pads 91 for the protocol chip 78 are remotely located from each other and are coupled via the transmission lines 88A, 88B provided as PCB traces in the PCB 62. For example, the photodiode 70 may be located at least 0.1 mm or approximately 0.1 mm away from the TIA circuit 76 in the protocol chip 78. Inductive and capacitive components may be provided along transmission lines 88A, 88B to control the impedance and reduce or eliminate capacitance to provide a low RC time constant for high bandwidth operation such as 5 Gbps or greater. In one embodiment, the transmission impedance $Z_2$ of the transmission lines 88A, 88B are also impedance-matched or substantially impedance-matched to the higher TIA input impedance $Z_1$ of differential TIA circuit 76 to provide for maximum energy transfer between the photodiode 70 and the differential TIA circuit 76. Substantial impedance-matching may provide that the transmission impedance $Z_2$ of the transmission lines 88A, 88B are within fifty percent (50%) of the TIA input impedance $Z_1$ of differential TIA circuit 76, or vice versa. Impedance matching minimizes any ringing on the transmission lines 88A, 88B. The TIA input impedance $Z_1$ of the differential TIA circuit 76 can also be designed to optimize the amount of optical power received from the photodiode 70, which may allow the need for an optical attenuator, which is conventional in low input impedance TIA designs in ROSAs.

By providing a higher TIA input impedance $Z_1$ in the differential TIA circuit 76, it may be desired to further reduce the RC time constant of the differential TIA circuit 76 to increase bandwidth performance of the ROA 60. In this regard, the size of the active region photodiode 70 can be selected to be smaller in size to minimize the capacitance $C_1$ of the photodiode 70. As a non-limiting example, the capacitance $C_1$ of the photodiode 70 may be between 0.6 picoFarads (p f) (i.e., at TIA input impedance $Z_1$ of 50 ohms and data rate at 10 Gpbs). Providing a smaller photodiode 70 provides a smaller cone for reception of input optical signals received over the receiver optical fiber 66R (see FIG. 4) and thus less received optical power to be converted into electrical signals. As a non-limiting example, the aperture of the photodiode 70 may be sized to vary from approximately one hundred (100) μm down to approximately fifty (50) μm down or twenty-five (25) μm for an eighty (80) μm optical fiber core. For example, the optical power output by the photodiode 70 may be 0.27 mA as a non-limiting example. But, less optical power conversion may be acceptable for the ROA 60 when employed in a short haul active optical fiber USB cable 68 or the like. In a short haul active optical fiber USB cable 68, there may not be an appreciable optical loss over the receiver optical fiber 66R. Thus, the signal-to-noise (S/N) ratio of the electrical signals provided by the photodiode 70 may still be acceptable for the ROA 60.

With continuing reference to FIG. 5, the differential TIA circuit 76 is a differential TIA having two differential input nodes 87A, 87B each coupled to a transmission line among the transmission lines 88A, 88B. The transmission lines 88A, 88B are each coupled to a respective node 90A, 90B of the photodiode 70 remotely located from the differential TIA circuit 76. Bond wires 93A, 93B may be employed to connect the nodes 90A, 90B of the photodiode 70 to the transmission lines 88A, 88B. Also in this embodiment, the differential TIA circuit 76 comprises two single-ended input TIAs 92A, 92B driving an output differential amplifier 94. More specifically, the differential TIA circuit 76 comprises two single-ended input TIAs 92A, 92B that produce single-ended outputs that are differentially combined in the output differential amplifier 94 to reject common-mode signals. The TIA 92B has its positive input terminal 96B connected to ground GND and TIA 92A has its positive input terminal 96A connected to power source 98, thereby placing the potential of the power source 98 across the photodiode 70. The negative input terminals 100A, 100B of the TIAs 92A, 92B are coupled to the photodiode 70 via the differential input nodes 87A, 87B connected to the transmissions lines 88A, 88B to put the photodiode 70 in a reverse bias operation to reduce intrinsic capacitance of the photodiode 70 to minimize the RC time constant of the TIAs 92A, 92B.

With continuing reference to FIG. 5, the transimpedance gains of the TIAs 92A, 92B are respectively set by the feedback resistors $R_{F1}$, $R_{F2}$, respectively. The TIA input impedances $Z_1$ at the negative input terminals 100A, 100B of the TIAs 92A, 92B, respectively, are set by the feedback resistors $R_{F1}$, $R_{F2}$, respectively and the amplifier gain for the frequency characteristics of the TIAs 92A, 92B and the frequency of the input electrical signals. In one embodiment, the input TIA impedances $Z_1$ of the TIAs 92A, 92B are impedance-matched or substantially impedance-matched to the transmission impedances $Z_2$ of the transmissions lines 88A, 88B. This reduces or inhibits ringing on the transmission lines 88A, 88B between the TIAs 92A, 92B and the photodiode 70 from causing pulse distortion.

With continuing reference to FIG. 5, the output nodes 102A, 102B are coupled as inputs to differential input nodes 104A, 104B to the output differential amplifier 94 to produce an output electrical signal on a differential TIA output node 106 representing the electrical signal representation of the received input optical signals by the photodiode 70. Environmental noise induced on the transmission lines 88A, 88B will cancel each other or substantially cancel each other in the output differential amplifier 94 through common mode rejection. This allows the differential TIA circuit 76 to be highly noise immune and be in close proximity to other noise circuits in the ROA 60 if needed or desired. For example, environmental noise can result from parasitic capacitances 105A, 105B coupled from a power source 107, which may be a switching power supply, to the photodiode 70. The conventional ROSA 20 in FIGS. 2 and 3, which does not employ common mode rejection, may not be able to be employed in a package or active optical cable containing a switching power supply. As another example, magnetic fields 109 provided by current in the power source 107 can be inductively coupled to the transmission lines 88A, 88B acting as antennas. The common mode rejection of the differential TIA circuit 76 may allow use of a switching power supply with the ROA 60, which may otherwise not be possible without degrading bandwidth performance. As another example, noise may be inserted into the ROA 60 from the transmission lines 88A, 88B receiving extraneous RF signals.

With continuing reference to FIG. 5, providing differential amplifiers in the differential TIA circuit 76 is acceptable for the ROA 60, because even with the added noise floor (e.g., +3 dB) of the two TIAs 92A, 92B, the short haul application of the ROA 60 provides lower loss and sufficient optical power level. This circuit feature of providing differential amplifiers in the differential TIA circuit 76 with common mode rejection can also save costs for the ROA 60, because the photodiode 70 and at least a portion of the transmission lines 88A, 88B that do not extend into the protocol chip packaging 84 do not have to be RF shielded to be immune or substantially immune to extraneous RF signal noise. The differential amplifier arrangement in the differential TIA circuit 76 allows more noise to be present on the transmission lines 88A, 88B because of the common mode rejection performed by the differential TIA circuit 76 without requiring additional components or features in the ROA 60 to reduce extraneous induced noise, such as RF shielding for example. The output electrical signal provided on the differential TIA output node 106 by the output differential amplifier 94 is provided to an input node 112 of a protocol circuit 108 that can be configured to convert the output electrical signal generated by the output differential amplifier 94 on the differential TIA output node 106 into the desired protocol (e.g., USB).

In summary, the TIAs 92A, 92B are provided to have a fixed TIA input impedance $Z_1$, which is not provided on conventional ROSA 20 in FIGS. 2 and 3 or other ROSAs. TIAs for ROSAs are typically designed for low input impedance to provide the lowest possible input RC time constant in conjunction with a photodiode capacitance. With the ROA 60 of FIG. 5, these conventional design features are purposefully disregarded and unconventional wisdom is used for the benefit of short haul active optical cables as one application example. The low input impedance is sacrificed by providing a higher, fixed TIA input impedance $Z_1$, which may be impedance-matched to the transmission impedance $Z_2$ of the transmission lines 88A, 88B, to remotely locate the photodiode 70 from the TIAs 92A, 92B as discussed above. To further reduce the effect of parasitic bond-wire inductances 109A, 109B that may be present in transmission lines 88A, 88B to further reduce the RC time constant, compensating capacitors 110A, 110B may be provided as illustrated in FIG. 5. The capacitance of the compensating capacitors 110A, 110B substantially equals the parasitic inductances 109A, 109B divided by the TIA 92A, 92B input impedance. Also note that a compensating inductor(s) can be provided in the ROA 60 in FIG. 5 to offset or reduce capacitance in the transmission lines 88A, 88B. Also note that either inductances or capacitances of the transmission lines 88A, 88B may be modified to compensate for excess capacitance or inductances to attempt to impedance-match the transmission impedance $Z_2$ with TIA input impedance $Z_1$, or otherwise provide the desired impedance of the transmission impedance $Z_2$.

With continuing reference to FIG. 5, the components of the ROA 60 can be physically arranged such that capacitive coupling from any voltage source inside an active optical cable in which the ROA 60 is disposed, including power source 107, is substantially balanced, such that induced voltages amplified by TIAs 92A, 92B are cancelled by output differential amplifier 94. Similarly, inductive flux sources, including power supply 107, can be located in an active optical cable including the ROA 60 such that the magnetic flux 109 is substantially balanced to the bond wires 93A, 93B such that induced currents as amplified by TIAs 92A, 92B are cancelled by output differential amplifier 94. The TIAs 92A, 92B may also be internally constructed to be identical or substantially identical such that any noise from the power supply 107 induced in the ROA 60, produce identical or substantially identical signals on the output nodes 102A, 102B to be cancelled or substantially cancelled by the output differential amplifier 94.

The TIAs 92A, 92B and the output differential amplifier 94 employed in the ROA 60 in FIG. 5 can be implemented in different designs and technologies to convert the current produced by the photodiode into an output voltage while adding as little noise to the output voltage as possible. For example, it may be desired to employ complementary metal oxide (CMOS) technology in the TIAs 92A, 92B and the output differential amplifier 94 in the ROA 60 in FIG. 5. CMOS technology has become an attractive technology for high speed analog circuits due to aggressive scaling and lower cost. In addition to the lower cost advantage, CMOS technology can also allow the ROA 60 to be more easily integrated with other digital electronics, including any other digital electronics provided on the PCB 62 as part of the USB connector 64 in FIG. 4.

In this regard, as discussed in examples below, CMOS-based TIAs can be provided in a ROA. In the CMOS-based TIAs, the output of the photodiode is coupled to the input of a CMOS-based gate structure. The photodiode is presented with a TIA input impedance that allows the differential TIA circuit to absorb electrical signals with capacitance components of the transmission circuit reduced to allow for higher bandwidth operation, but with a low enough input impedance to isolate the photodiode capacitance from determining the bandwidth of the system. The ability of a common CMOS-based gate structure to isolate a large photodiode capacitance is limited by the transconductance of CMOS-based input transistor. To lower the input impedance, the size of the transistor can be increased to increase gain. But this raises the bias current and adds to the parasitic capacitance (i.e., gate to source capacitance) of the TIA, thus limiting the bandwidth capability of the TIA.

Figure 7:
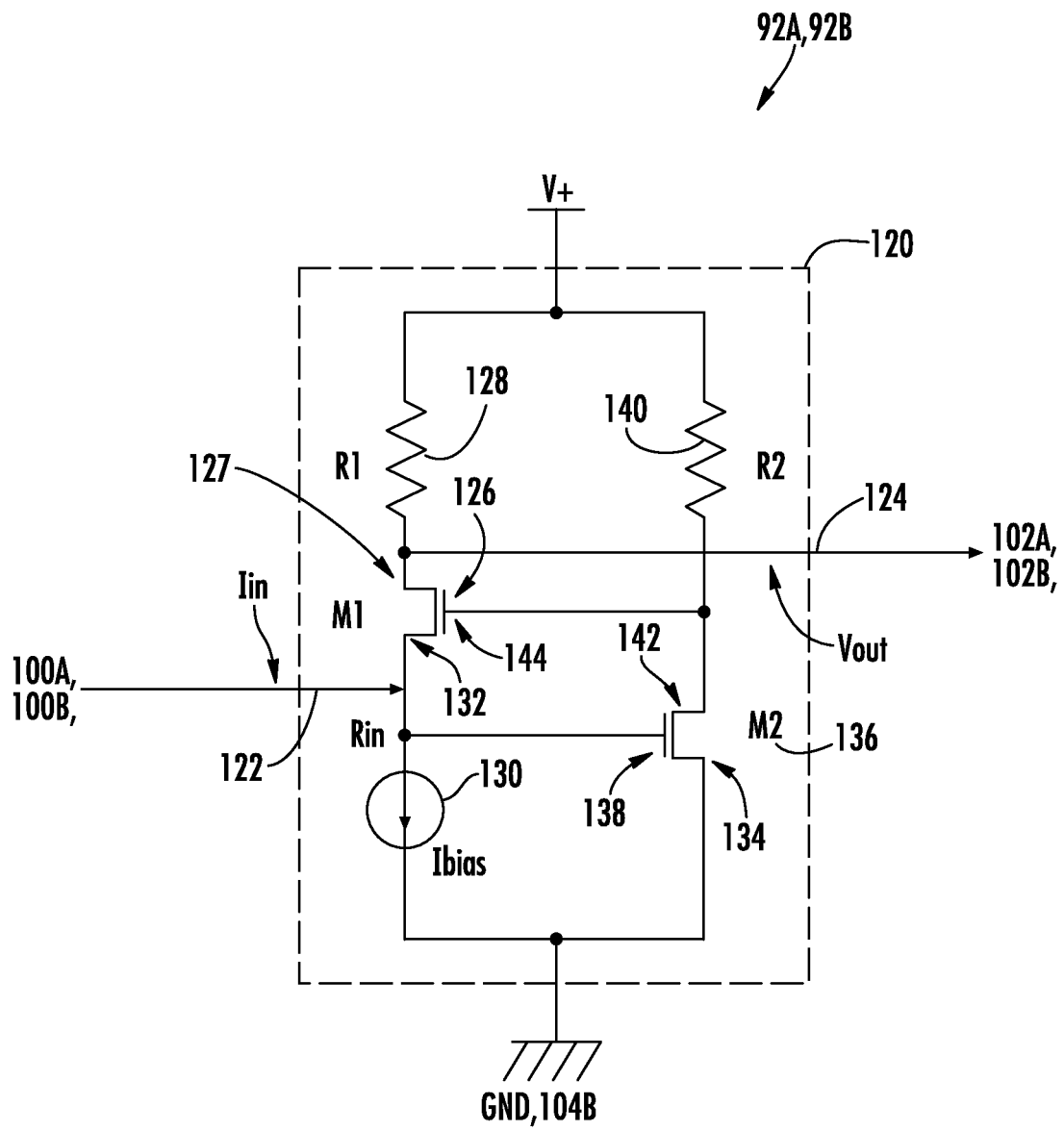
FIG. 7 is a schematic diagram of an exemplary complementary metal oxide (CMOS)-based higher input impedance TIA with active feedback bias current that can be employed for the TIAs provided in the ROA of FIG. 5.

To solve this problem, a regulated cascade TIA employing CMOS-based gates can be employed. In this regard, FIG. 7 is a schematic diagram of exemplary complementary metal oxide (CMOS)-based higher input impedance TIA 120 with active feedback bias current that can be employed for. The TIAs 92A, 92B in the ROA 60 of FIG. 5. The TIA 120 in FIG. 7 is a regulated cascade TIA. Because the TIA 120 is discussed as being able to be employed in the TIAs 92A, 92B in the ROA 60 in FIG. 5, the input node 122 of the TIA 120 in FIG. 7 is shown as being able to be coupled to negative input terminals 100A, 100B of the TIAs 92A, 92B. Likewise, the output node 124 of the TIA 120 in FIG. 7 is shown as being able to be coupled to the output nodes 102A, 102B of the TIAs 92A, 92B, respectively.

With continuing reference to FIG. 7, TIA 120 includes a common gate transistor 126 (M1) with a resistive load represented by resistor 128 (R1). The common gate transistor 126 (M1) transfers the input current $I_{in}$ on input node 122 as a source follower from a drain 127 to resistor 128 (R1) to generate an output voltage $V_{out}$ on output node 124. A bias current 130 (Ibias) is provided to the source 132 of the common gate transistor 126 (M1) by a source 134 of a second transistor 136 (M2) as part of a local feedback loop. The local feedback loop reduces a TIA input resistance $R_{in}$ by approximately the value of the voltage gain of the TIA 120. The local feedback loop is provided by the input node 122 of the TIA 120 being coupled to a gate 138 of a second transistor 136 (M2). A drain 142 of the second transistor 136 (M2) is coupled to a gate 144 of the common gate transistor 126 (M1). In this manner, the second transistor 136 (M2) drives the gate 144 of the common gate transistor 126 (M1) with the bias current 130 (Ibias), based on signal at the input node 122 providing the gate 138 to source 134 voltage of second transistor 136 (M2).

With continuing reference to FIG. 7, when the voltage at the input node 122 droops or sags in the presence of a sinusoidal input current $I_{in}$ because of the lower initial TIA input resistance $R_{in}$ of the common gate transistor 126 (M1), this causes an increase in the TIA input resistance $R_{in}$ at input node 122, which is not desired. Thus, to compensate for droop or sag of the voltage at input node 122, the input current $I_{in}$ at the input node 122, being coupled to the gate 138 of the second transistor 136 (M2), reduces the bias current 130 (Ibias) provided by the second transistor 136 (M2) to the common gate transistor 126 (M1). This causes the voltage at the second resistor 140 (R2) to rise, because the voltage at gate 138 of the second transistor 136 (M2) is set by the supply voltage V+ minus the voltage drop across the second resistor 140 (R2), minus gate 144 to source 132 voltage of the common gate transistor 126 (M1). This rise in voltage at the second resistor 140 (R2) pulls the reference level of the common gate transistor 126 (M1) higher to compensate for the droop or sag at the input node 122 to maintain the lower TIA input impedance $Z_3$. The TIA input resistance $R_{in}$ of the TIA 120 at the input node 122 is effectively divided by the current gain of common gate transistor 126 (M1). Thus, the TIA input resistance $R_{in}$ of the TIA 120 is provided as follows:

$R_{in} \approx 1/(g_{M1}*(1+g_{M2}R2))$, where:

$g_{M1}$ is the transconductance of common gate transistor 122 (M1);

$g_{M2}$ is the transconductance of second transistor 136 (M2); and

R2 is the resistance of second resistor 140 (R2).

By maintaining the TIA input resistance $R_{in}$ of the TIA 120, the capacitance of the photodiode 70 in FIG. 5 coupled to the input node 122 is effectively decoupled from the TIA 120, such that the photodiode 70 capacitance does not determine the bandwidth of the TIA 120.

Without the feedback of second transistor 136 (M2) and second resistor 140 (R2) in the TIA 120 in FIG. 7, the TIA input impedance $Z_3$ would simply be the reciprocal of the transconductance of common gate transistor 126 (M1). Thus in this scenario, as described above, the ability of the common gate transistor 126 (M1) to isolate a large photodiode 70 capacitance would be limited by this transconductance of the common gate transistor 126 (M1), thus requiring the common gate transistor 126 (M1) size to be increased with the undesired consequence of raising the bias current and adding parasitic input capacitance.

One issue with the TIA 120 in FIG. 7 is that the bias point of the local feedback loop is a function of the supply voltage V+ and is thus limited by the supply voltage V+. If the TIA 120 in FIG. 7 is employed in noisy environments, such as environments employing switched regulators, the supply voltage V+ may be noisy. As illustrated in FIG. 7 and previously discussed above, the voltage at gate 138 of the second transistor 136 (M2) is set by the supply voltage V+ minus the voltage drop across the second resistor 140 (R2), minus gate 144 to source 132 voltage of the common gate transistor 126 (M1). Thus, the gain of the local feedback loop of the TIA 120 is proportional to the voltage drop across the second resistor 140 (R2), because the voltage drop across the second resistor 140 (R2) varies the current bias 130 (Ibias) provided by the second transistor 136 (M2) to the common gate transistor 126 (M1). Thus, if the supply voltage V+ includes noise, this noise would get converted into the output voltage at the output node 124 of the TIA 120 in FIG. 7, thus reducing the effective bandwidth of the TIA 120.

Figure 8:
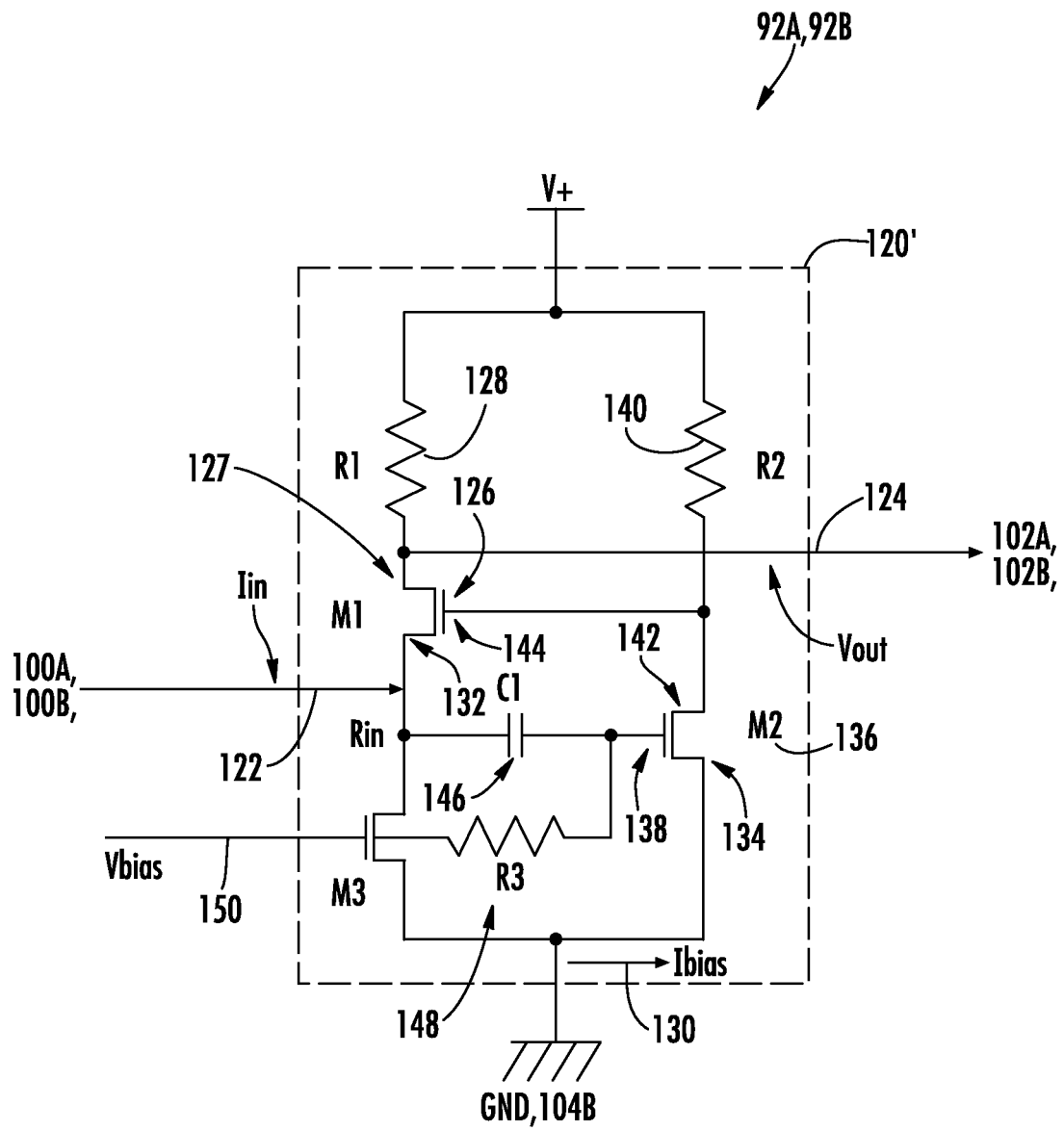
FIG. 8 is a schematic diagram of an alternative exemplary complementary metal oxide (CMOS)-based higher input impedance TIA that can be employed for the TIAs in the ROA of FIG. 5, wherein the CMOS-based TIA employs an independent active feedback bias current.

In this regard, FIG. 8 is a schematic diagram of an alternative exemplary complementary metal oxide (CMOS)-based higher input impedance TIA 120. The TIA 120' employs an active feedback bias current independently set from the supply voltage V+, as opposed to current bias 130 (Ibias) in the TIA 120 in FIG. 7 that is set by the supply voltage V+. In this manner, as discussed in more detail below, the second transistor 136 (M2) is biased in a way that does not involve supply voltage V+. Thus, noise on the supply voltage V+ is not converted to voltage on the output node 124 by the common gate transistor 126 (M1). Before discussing more details regarding the TIA 120' in FIG. 8, it is first noted that TIA 120' in FIG. 8 includes some common components with the TIA 120 in FIG. 7 previously described above. These common components are labeled with common element numbers in FIGS. 7 and 8. Thus, these common components will not be re-described here.

With reference to FIG. 8, capacitor 146 (C1) and a third resistor 148 (R3) are provided in the TIA 120' that are not provided in the TIA 120 in FIG. 7. An independent bias input 150 is coupled to the third resistor 148 (R3) to control an input bias voltage (Vbias) provided to the second transistor 136 (M2). The direct current (DC) bias point of the second transistor 136 (M2) is adjusted by the input bias voltage (Vbias) on the bias input 150. For example, a diode connected N-type CMOS-based transistor (NMOS transistor) (not shown) could be connected between the bias input 150 and ground (GND) and applying a known bias current to the input bias 150. This allows the transimpedance of the second transistor 136 (M2) to be independently set from the supply voltage V+ or the common gate transistor 126 (M1) when the frequency of the input signal on the input node 122 is at lower frequencies below the time constant of third resistor 148 (R3) and the capacitor 146 (C1) (hereinafter the R3-C1 time constant). The second transistor 136 (M2) may be independently sized with the second resistor 140 (R2) to determine the loop gain of the TIA 120'.

With continuing reference to FIG. 8, the capacitor 146 (C1) provides DC isolation between an alternating current (AC) input signal on the input node 122 and the DC input voltage (Vbias) set by the bias point of the common gate transistor 126 (M1). Thus, when the frequency of the input signal at the input node 122 is above the R3-C1 time constant, the voltage of the gate 138 of the second transistor 136 (M2) is driven by the voltage at the input node 122. Thus, the bias current 130 (Ibias) provided by the second transistor 136 (M2) to the common gate transistor 126 (M1) is controlled by the input node 122, as provided in the TIA 120 in FIG. 7. Thus in this scenario, as described above, the input current $I_{in}$ at the input node 122, being coupled to the gate 138 of the second transistor 136 (M2), reduces the bias current 130 (Ibias) provided by the second transistor 136 (M2) to the common gate transistor 126 (M1). This causes the voltage at the second resistor 140 (R2) to rise, because the voltage at gate 138 of the second transistor 136 (M2) is set by the supply voltage V+ minus the voltage drop across the second resistor 140 (R2), minus gate 144 to source 132 voltage of the common gate transistor 126 (M1). This rise in voltage at the second resistor 140 (R2) pulls the reference level of the common gate transistor 126 (M1) higher to compensate for the droop or sag at the input node 122 to maintain the TIA input impedance $Z_3$ at high frequencies. The transimpedance of the TIA 120' is determined by resistor 128 (R1), as provided in the TIA 120 in FIG. 7.

Note that in the TIAs 120, 120' in FIGS. 7 and 8, the transistor devices are not limited to any particular device type. The transistors could be provided in P-type CMOS-based transistors (PMOS transistors), NMOS transistors, or a mixture of each, as desired. Bipolar devices or other similar devices may also be employed.

Many modifications and other embodiments of the embodiments set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

I claim:

1. A receiver optical assembly (ROA), comprising:
   a photo-detector disposed in an optical header packaging, the photo-detector configured to detect and convert input optical signals into output electrical signals;
   a complementary metal oxide semiconductor (CMOS)-based differential transimpedance amplifier (TIA) circuit disposed in an integrated circuit remotely located from the optical header packaging, the CMOS-based differential TIA circuit comprising a first differential input node and a second differential input node, and the CMOS-based differential TIA circuit having a TIA input impedance of at least ten (10) ohms to reduce a ringing effect over the first differential input node and the second differential input node; and
   a transmission circuit comprised of a first transmission line coupled to the first differential input node, and a second transmission line coupled to the second differential input node;
   a first node of the photo-detector coupled to the first transmission line and a second node of the photo-detector coupled to the second transmission line to couple the photo-detector to the CMOS-based differential TIA circuit to amplify the output electrical signals received from the photo-detector.

2. The ROA of claim 1, wherein the CMOS-based differential TIA circuit further comprises:
   an output node;
   a common gate transistor coupled to the first differential input node and the output node; and
   a second transistor coupled to the first differential input node, the second transistor configured to transfer a bias current from the first differential input node to the common gate transistor;
   the common gate transistor configured to transfer amplified output electrical signals from the photo-detector on the first differential input node to the output node based on the bias current controlled by the second transistor.

3. The ROA of claim 2, wherein:
   a source of the common gate transistor is coupled to the first differential input node;
   a drain of the common gate transistor is coupled to the output node;
   a gate of the common gate transistor is coupled to a drain of the second transistor;
   a gate of the second transistor and a source of the second transistor are coupled to the first differential input node.

4. The ROA of claim 2, further comprising:
   a bias input coupled to the second transistor;
   a resistor having a first resistance coupled between the bias input and the second transistor; and
   a capacitor having a first capacitance coupled between the first differential input node and the second transistor;
   the second transistor configured to be biased by the bias input when a signal on the first differential input node has a frequency less than a resistance-capacitance time constant of the resistor and the capacitor; and
   the second transistor configured to be biased by the first differential input node when the signal on the first differential input node has a frequency higher than the resistance-capacitance time constant of the resistor and the capacitor.

5. The ROA of claim 4, wherein:
   a source of the common gate transistor is coupled to the first differential input node;
   a drain of the common gate transistor is coupled to the output node;
   a gate of the common gate transistor is coupled to a drain of the second transistor;
   the capacitor is coupled between a gate of the second transistor and the first differential input node; and
   the resistor is coupled between the gate of the second transistor and the bias input.

6. The ROA of claim 1, wherein the CMOS-based differential transimpedance amplifier (TIA) circuit is remotely located from the photo-detector by at least approximately 1.0 millimeter (mm).

7. The ROA of claim 1, wherein the TIA input impedance of the CMOS-based differential TIA circuit is approximately 35 ohms.

8. The ROA of claim 1, wherein the TIA input impedance of the CMOS-based differential TIA circuit is between approximately ten (10) ohms and two hundred (200) ohms.

9. The ROA of claim 1, wherein a transmission impedance of the transmission circuit is impedance matched or substantially impedance-matched to the TIA input impedance of the CMOS-based differential TIA circuit.

10. The ROA of claim 1, further comprising at least one compensating capacitor coupled to at least one of the first node and the second node of the photo-detector to reduce parasitic inductance of the photo-detector.

11. The ROA of claim 1, further comprising at least one compensating inductor coupled to at least one of the first node and the second node of the photo-detector to reduce parasitic capacitance of the photo-detector.

12. The ROA of claim 1, wherein the CMOS-based differential TIA circuit further comprises:
   a first CMOS-based TIA containing the first differential input node coupled to the first transmission line, and
   a second CMOS-based TIA containing the second differential input node coupled to the second transmission line.

13. The ROA of claim 12, wherein the CMOS-based differential TIA circuit further comprises an output CMOS-based differential amplifier having a first differential input node coupled to a first output node of the first CMOS-based TIA, and a second differential input node coupled to a second output node of the second CMOS-based TIA, the CMOS-based differential amplifier configured to reject common noise amplified by the first CMOS-based TIA and the second CMOS-based TIA.

14. A method of assembly of a receiver optical assembly (ROA), comprising:
   disposing a photo-detector in an optical header packaging on a printed circuit board (PCB), the photo-detector configured to detect and convert input optical signals into output electrical signals;
   disposing a complementary metal oxide semiconductor (CMOS)-based differential transimpedance amplifier (TIA) circuit provided in an integrated circuit on the PCB remotely located from the optical header packaging, the CMOS-based differential TIA circuit comprising a first differential input node and a second differential input node, and the CMOS-based differential TIA circuit having a TIA input impedance of at least ten (10) ohms to reduce a ringing effect over the first differential input node and the second differential input node;
   disposing a transmission circuit in the PCB comprised of disposing a first transmission line as a first PCB trace in the PCB and a second transmission line as a second PCB trace in the PCB;
   coupling the first differential input node of the CMOS-based differential TIA circuit to the first transmission line and coupling the second differential input node of the CMOS-based differential TIA circuit to the second transmission line; and
   coupling a first node of the photo-detector to the first transmission line and coupling a second node of the photo-detector to the second transmission line to couple the photo-detector to the CMOS-based differential TIA circuit to amplify the output electrical signals received from the photo-detector.

15. The method of claim 14, comprising impedance matching or substantially impedance matching the TIA input impedance with a transmission impedance of the transmission circuit.

16. The method of claim 14, further comprising not RF shielding the optical header packaging.

17. The method of claim 14, further comprising not providing a transimpedance amplifier in the optical header packaging.

18. A receiver optical assembly (ROA), comprising:
   a photo-detector disposed in an optical header packaging, the photo-detector configured to detect and convert input optical signals into output electrical signals;
   a complementary metal oxide semiconductor (CMOS)-based differential transimpedance amplifier (TIA) circuit comprising:
      a first CMOS-based TIA having a first differential input node and a first output node;
      a second CMOS-based TIA having a second differential input node and a second output node; and
      an output CMOS-based differential amplifier having a first differential input node coupled to the first output node of the first CMOS-based TIA, and a second differential input node coupled to the second output node of the second CMOS-based TIA, the output CMOS-based differential amplifier configured to reject common noise amplified by the first CMOS-based TIA and the second CMOS-based TIA;
      the CMOS-based differential TIA circuit having a TIA input impedance of at least ten (10) ohms to reduce a ringing effect over the first differential input node and the second differential input node; and
   a transmission circuit comprised of a first transmission line coupled to the first differential input node of the first CMOS-based TIA, and a second transmission line coupled to the second differential input node of the second CMOS-based TIA; and
   a first node of the photo-detector coupled to the first transmission line and a second node of the photo-detector coupled to the second transmission line to couple the photo-detector to the CMOS-based differential TIA circuit to amplify the output electrical signals received from the photo-detector.

19. The ROA of claim 18, wherein:
   the first CMOS-based TIA further comprises:
      a first common gate transistor coupled to the first differential input node and the first output node; and
      a second transistor coupled to the first differential input node, the second transistor configured to transfer a bias current from the first differential input node to the first common gate transistor;
      the first common gate transistor configured to transfer amplified output electrical signals from the photo-detector on the first differential input node to the first output node based on the bias current controlled by the second transistor; and
   the second CMOS-based TIA further comprises:
      a second common gate transistor coupled to the second differential input node and the second output node; and
      a third transistor coupled to the second differential input node, the third transistor configured to transfer a bias current from the second differential input node to the second common gate transistor;
      the second common gate transistor configured to transfer amplified output electrical signals from the photo-detector on the second differential input node to the second output node based on the bias current controlled by the third transistor.

20. The ROA of claim 19, wherein:
   the first CMOS-based TIA further comprises:
      a first bias input coupled to the second transistor;
      a first resistor having a first resistance coupled between the first bias input and the second transistor; and
      a first capacitor having a first capacitance coupled between the first differential input node and the second transistor;
      the second transistor configured to be biased by the first bias input when a signal on the first differential input node has a frequency less than the resistance-capacitance time constant of the first resistor and the first capacitor; and the second transistor configured to be biased by the first differential input node when the signal on the first differential input node has a frequency higher than the resistance-capacitance time constant of the first resistor and the first capacitor; and the second CMOS-based TIA further comprises:
- a second bias input coupled to the third transistor;
- a second resistor having a second resistance coupled between the second bias input and the third transistor; and
- a second capacitor having a second capacitance coupled between the second differential input node and the third transistor;
- the third transistor configured to be biased by the second bias input when a signal on the second differential input node has a frequency less than a resistance-capacitance time constant of the second resistor and the second capacitor; and
- the third transistor configured to be biased by the second differential input node when the signal on the second differential input node has a frequency higher than the resistance-capacitance time constant of the second resistor and the second capacitor.

21. An integrated circuit, comprising:
a complementary metal oxide semiconductor (CMOS)-based differential transimpedance amplifier (TIA) circuit comprising a first differential TIA having a first single-ended input node and a second differential TIA having a second single-ended input node that produce single-ended outputs that are differentially combined in an output differential amplifier to reject common-mode signals, and the CMOS-based differential TIA circuit having a TIA input impedance of at least ten (10) ohms to reduce a ringing effect over the first single-ended input node and the second single-ended differential input node.

22. The integrated circuit of claim 21, wherein the integrated circuit is a portion of a receiver optical assembly (ROA).

23. The integrated circuit of claim 22, wherein the ROA is a portion of an active optical cable.

* * * * *